United States Patent [19]
Erickson et al.

[11] Patent Number: 5,646,564
[45] Date of Patent: Jul. 8, 1997

[54] PHASE-LOCKED DELAY LOOP FOR CLOCK CORRECTION

[75] Inventors: Charles R. Erickson, Fremont; Philip M. Freidin, Sunnyvale, both of Calif.; Kerry M. Pierce, Canby, Oreg.

[73] Assignee: Xilinx, Inc., San Jose, Calif.

[21] Appl. No.: 632,523

[22] Filed: Apr. 12, 1996

Related U.S. Application Data

[63] Continuation of Ser. No. 300,608, Sep. 2, 1994, abandoned.

[51] Int. Cl.$^6$ .................... H03L 7/00; H03K 5/00
[52] U.S. Cl. .................... 327/158; 327/161; 327/244; 327/250; 327/5; 327/12; 327/276; 327/269
[58] Field of Search .................... 327/147, 149, 327/153, 155, 156, 158, 141, 146, 3, 5, 7, 12, 276, 277, 269, 270, 271, 243, 244, 250, 161

[56] References Cited

U.S. PATENT DOCUMENTS

| | | | |
|---|---|---|---|
| 4,051,440 | 9/1977 | Nelson et al. | 327/5 |
| 4,222,013 | 9/1980 | Bowers et al. | 327/12 |
| 4,322,643 | 3/1982 | Preslar | 307/528 |
| 5,039,893 | 8/1991 | Tomisawa | 327/276 |
| 5,052,031 | 9/1991 | Molloy | 331/25 |
| 5,068,628 | 11/1991 | Ghoshal | 327/7 |
| 5,087,829 | 2/1992 | Ishibashi et al. | 327/158 |
| 5,099,477 | 3/1992 | Taniguchi et al. | 327/147 |
| 5,109,394 | 4/1992 | Hjerpe et al. | 375/119 |
| 5,120,990 | 6/1992 | Koker | 327/2 |
| 5,144,254 | 9/1992 | Wilke | 327/156 |
| 5,173,617 | 12/1992 | Alsup et al. | 307/269 |
| 5,191,295 | 3/1993 | Necoechea | 327/244 |
| 5,204,564 | 4/1993 | Ochiai | 327/269 |
| 5,208,546 | 5/1993 | Nagaraj et al. | 328/155 |
| 5,210,509 | 5/1993 | Greef et al. | 331/4 |
| 5,216,302 | 6/1993 | Tanizawa | 327/244 |

(List continued on next page.)

FOREIGN PATENT DOCUMENTS 9117645  8/1992  United Kingdom.

OTHER PUBLICATIONS

A. Efendovich, Y. Afek, C. Sella, Z. Bikowsky, "Multi–Frequency Zero–Jitter Delay–Locked Loop", pp. 27.1.1–27.1.4, IEEE 1993, Custom Integrated Circuits Conference.

T. Lee, K. Donnelly, J. Ho, J. Zerbe, M. Johnson, T. Ishikawa, "A 2.5V Delay–Locked Loop for an 18 Mb 500 MB/s DRAM", IEEE International Solid–State Circuits Conference, ISSCC94/Session 18/High–Performance Logic and Circuit Techniques/Paper FA 18.6, 1994.

A. Waizman, "A Delay Line Loop for Frequency Synthesis of De–Skewed Clock", IEEE International Solid–State Circuits Conference, ISSCC94/Session 18/High–Performance Logic and Circuit Techniques/Paper FA 18.5, 1994.

Primary Examiner—Timothy P. Callahan
Assistant Examiner—Eunja Shin
Attorney, Agent, or Firm—Edel M. Young

[57] ABSTRACT

A controlled delay path inserts a selected delay into a clock distribution circuit to create a total clock delay that is equal to an integer number of clock cycles relative to a reference input clock signal or which produces a selected phase relationship to the reference clock signal. The delay path correction of the invention is particularly useful in circuits having a wide range of possible system clock frequencies or having programmable routing of clock signals, and therefore a wide range of operating delays. A reference input clock signal is directed to a range of selectable voltage controlled delay elements by a phase detector that receives the reference input clock signal and a feedback signal, and that produces an error voltage which adjusts the voltage controlled delay elements to produce an output clock signal. Additional selectable delays may be included that create offset options and allow selection of a leading, lagging, or in-phase reference input clock/output clock relationship. In one form of the invention, an inverter adapted to invert one of the reference input clock and output clock signals, and a divide by N circuit for lowering the clock frequency while roughly adjusting the delay.

12 Claims, 8 Drawing Sheets

U.S. PATENT DOCUMENTS

| | | | |
|---|---|---|---|
| 5,220,294 | 6/1993 | Ichikawa | 331/17 |
| 5,223,755 | 6/1993 | Richley | 327/158 |
| 5,260,608 | 11/1993 | Marbot | 307/262 |
| 5,307,028 | 4/1994 | Chen | 327/157 |
| 5,355,037 | 10/1994 | Anderssen et al. | 327/269 |
| 5,389,843 | 2/1995 | McKinney | 327/276 |
| 5,428,309 | 6/1995 | Yamauchi et al. | 327/277 |
| 5,430,394 | 7/1995 | McMinn et al. | 327/276 |
| 5,463,337 | 10/1995 | Leonowich | 327/269 | ns a clock signal having a frequency that is greater
PHASE-LOCKED DELAY LOOP FOR CLOCK CORRECTION This application is a continuation of application Ser. No. 08/300,608, filed Sep. 2, 1994 now abandoned.

BACKGROUND OF THE INVENTION

1. Technical Field

The present invention relates to clock distribution in digital circuits. More particularly, the present invention relates to a controlled delay path for phase synchronizing an output clock signal to a reference input clock signal.

2. Description of the Prior Art

Modern digital electronic systems are comprised of a number of cooperating sequential logic circuits that each perform several routine operations, and that are each controlled by derivatives of a common clock signal. The clock signals must be synchronized at locations within the system if the system is to function optimally. Although the individual clock signals may have a common source, they often do not arrive at their intended destinations in proper synchronism, for example due to variations in signal propagation delay for each destination. Thus, combining several complex sequential logic circuits within a system presents a challenge with respect to synchronizing the time frames of each of the circuits with each other.

Because synchronous sequential logic circuits change states only at the rising or falling edge of a synchronous clock signal, proper circuit operation requires that any external input signals to the synchronous sequential logic circuit must occur with the proper set up time ($t_{su}$) and hold time ($t_h$) requirements relative to the designated clock edge. However, in a system comprised of sequential logic circuits having a master system clock that operates the several diverse system circuits there is a problem with skew between the system clock and the destination clock signals propagated through the various circuits.

As integration levels of microelectronic circuits and system complexity continues to increase, the routing or distribution of a master system clock becomes more critical. This problem is exacerbated in view of ever increasing clock rates. Thus, clock distribution in a complex integrated circuit requires careful selection of a routing scheme, including such considerations as distribution topography across the circuit, propagation delays in routing the clock signal to all elements on the circuit, desired set up and hold times, and variations in system design parameters, such as system clock rate, that can affect circuit operation.

One solution to this problem is to employ a voltage controlled oscillator in a phase-locked loop to adjust the various signals, such that the edges of the internal clock signals are aligned with those of the master or reference clock signal. The phase-locked loop provides feedback that is used to null out clock distribution delays within the circuit by comparing the phase of a first signal with that of a second signal. The difference between the two signals is used in a feedback control system to bring the first and second signals into a fixed phase relation. With regard to a clock distribution scheme, the first signal is typically a reference signal derived from the master system clock, and the second signal is typically a controlled signal of variable frequency.

Although analog phase-locked loops were first used in clock distribution circuits, digital phase-locked loops have gained wider acceptance. In such digital phase-locked loops, a digital phase detector is used, although the phase-locked loop architecture is otherwise composed of analog elements, i.e. voltage controlled oscillator, loop filter. See for example A. Wray, *Clock Synchronization Circuit for Digital Communications System*, UK Patent Application No. GB 9117645 (15 Aug. 1992) which discloses a burst-mode TDMA system including a clock synchronization circuit that provides a clock signal having a frequency that is greater than the signal frequency of the received data signal. An AND gate and divider logically combine the clock signal with the received data signal to provide a synchronization signal for the digital communications system. The synchronization signal is compared with the received data signal and an error signal is generated in response to the difference. Delay circuitry successively introduces delays to the clock signal to reduce the error in response to transitions of the synchronization signal until the synchronization and received data signals are synchronized.

See, also M. Alsup, C. Dobbs, E. Haddad, C. Moughanni, Y. Wu, *Digital Phase Lock Clock Generator Without Local Oscillator*, U.S. Pat. No. 5,173,617 (22 Dec. 1992) (digital phase-locked loop including a phase detector that controls, and an up-down counter to program, an increase/decrease in a tapped delay line); J. Hjerpe, D. Russell, R. Young, *All Digital Phase-Locked Loop*, U.S. Pat. No. 5,109,394 (28 Apr. 1992) (digital phase-locked loop for synchronizing an output clock with a reference clock signal, including a multiple-tap, digital delay chain to delay the output clock signal); D. Preslar, *Digital Phase Comparator With Improved Sensitivity For Small Phase Differences*, U.S. Pat. No. 4,322,643 (30 Mar. 1982) (digital phase comparator for eliminating the dead zone in the phase correction means of a phase-*locked loop*); A. Efendovich, Y. Afek, C. Sella, Z. Bikowsky, *Multi-Frequency Zero-Jitter Delay-Locked Loop*, IEEE 1993 Custom Integrated Circuits Conference (1993) (all digital delay-locked loop); T. Lee. K. Donnelly, J. Ho, J. Zerbe, M. Johnson, T. Ishikawa, *A 2.5 V Delay-Locked Loop for an* 18 Mb 500 MB/s *DRAM*, IEEE International Solid-State Circuits Conference (1994) (receive delay-locked loop); and A. Waizman, *A Delay Line Loop for Frequency Synthesis of De-Skewed Clock*, IEEE International Solid-State Circuits Conference (1994) (delay line loop clock generator circuit used for frequency synthesis multiplication of a de-skewed clock).

Modern system designs may specify a wide range of system clock rates, e.g. from 10-MHz or less to 100-MHz or more. When it is considered that clock distribution may consume 20% or more of a clock period, it is clear that clock delays, while not critical at slower clock rates (for example at 10-MHz, where a clock delay of 5 nsec is about 5% of a clock period of 100 nsec), become extremely critical at faster clock rates (for example at 100-MHz, where a clock delay of 5 nsec (i.e. 50%) is unacceptable when compared to a clock period of 10 nsec). While a phase-locked loop may include a series of tapped delays, such as buffers, voltage controlled delays, shift registers, and the like, to extend its range of operation, such expedients take up considerable space, while providing only a minimal amount of range of operation extension. Thus, while a phase-locked loop may be useful for a narrow range of system clock rates, it is not practical for complex integrated circuits that are intended for a wide variety of system applications over a broad range of system clock rates.

There is no need for a phase-locked loop having a voltage controlled oscillator if the system provides a master clock of the correct frequency, because the fundamental problem is aligning the edges of the system clock precisely with those of the internal device clocks such that all system elements operate in synchronism. Accordingly, there is a need to synchronize (i.e. de-skew or match rising edges) output clock signals with that of a master clock in a precise and stable manner over a wide range of operating parameters and reference clock frequencies, so as to cancel uncertainty introduced by internal clock distribution delays.

SUMMARY OF THE INVENTION

The present invention provides a controlled delay path that inserts a selected delay into a clock distribution circuit to create a total delay at a selected location that is equal to an integer number of clock cycles. The invention is particularly useful for matching the phase of an output clock signal to that of a reference input clock signal, for example by introducing a selected delay, such that the output clock is delayed sufficiently to compensate for propagation delays associated with distribution of the clock to its destination. That is, such that the edges of the output and reference clock signals are in-phase, even though the output clock signal may be displaced from the reference input clock signal by one or more cycles. Thus, the invention is especially useful in connection with circuits having a wide range of possible system clock rates, and therefore a wide range of operating delays, for example as are found in programmable logic devices, such as field programmable gate arrays.

The invention comprises a delay circuit in which a reference clock signal is provided to one or more selectable voltage controlled delay elements to produce a delay corrected output clock signal that is used to clock the various internal sequential logic elements of each system component. A phase detector receives the reference input clock signal and a feedback signal from the output, and produces a corresponding error voltage that drives one or more voltage controlled delay elements. The circuit thereby introduces a delay that adjusts the timing of the output clock signal, based upon specific output clock signal routing and other propagation delays. Additional selectable delays may be included to create offsets that permit the output clock signal to appear as leading, lagging, or in-phase relative to the reference input clock signal.

An alternative embodiment of the invention inverts one of the two phase detector input signals such that the negative transition of one of the signal input to the phase comparator is aligned to the positive transition of the other signal input to the phase comparator, and such that the delay is adjusted to correspond to the LOW time of the non-inverted signal. Additionally, a divide by N circuit is provided to adjust the delay to a multiple of the input period. In this way, an initial or rough delay adjustment may be made to bring the circuit to within its normal operating range, after which the circuit may be switched to another mode of operation.

DETAILED DESCRIPTION OF THE INVENTION

The present invention provides a controlled delay path that inserts additional delay into a clock distribution circuit to create a total delay at a selected location that is equal to an integer number of clock cycles, and that thereby compensates for the uncertainty associated with propagation delay that occurs during clock distribution in digital systems. The invention is particularly useful for matching the phase of an output clock signal to a reference input clock signal, for example by introducing a selected delay, such that compensation is provided for propagation delays associated with distribution of the output clock signal. The invention is especially useful in circuits that may be operated with a wide range of system clocks, and therefore a wide range of operating delays, such as programmable logic devices, e.g. field programmable logic devices.

Figure 1:
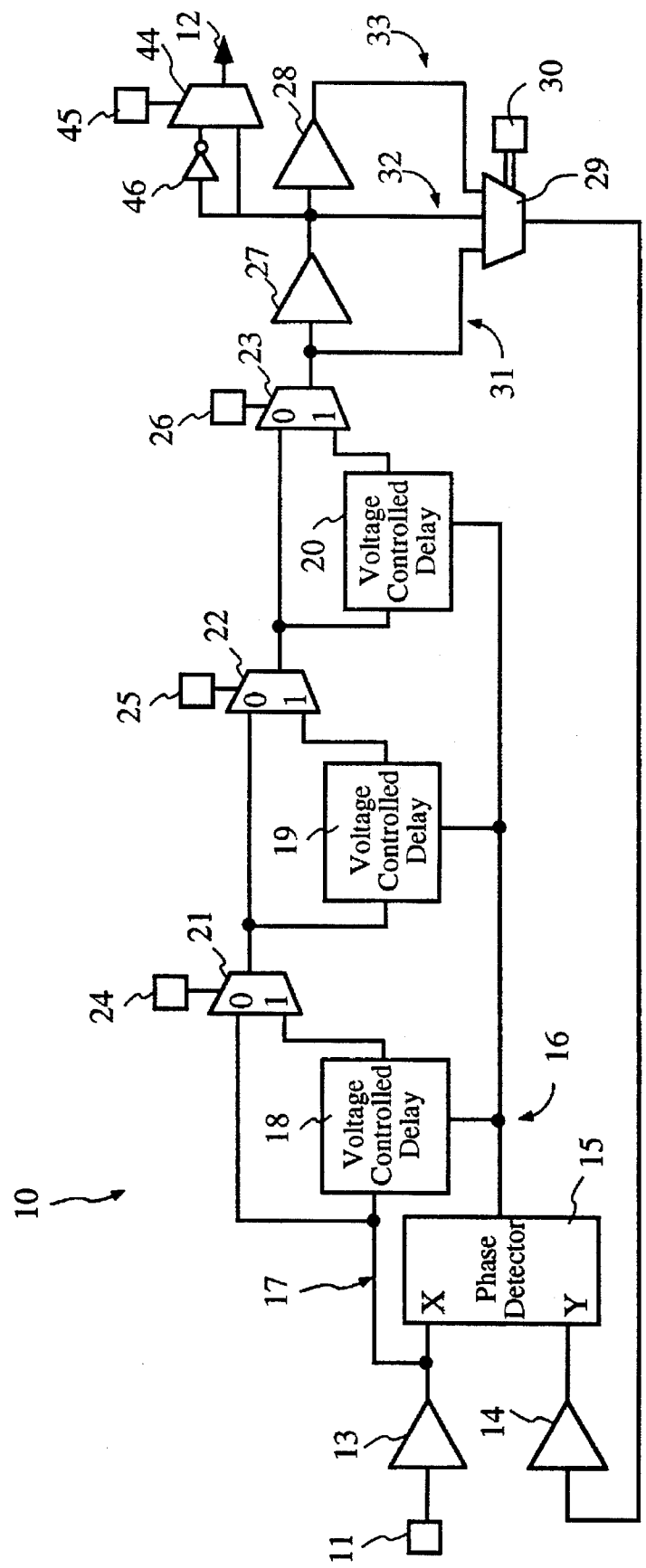
FIG. 1 is a block level schematic diagram showing a phase-locked loop that incorporates a series of selectable voltage controlled delay elements according to the present invention.

FIG. 1 is a block level schematic diagram showing a phase-locked loop 10 that incorporates a series of selectable voltage controlled delay elements 18, 19, 20. The voltage controlled delay elements produce a delay corrected output clock signal in response to a varying control voltage input. Each of voltage controlled delay elements 18, 19, and 20 has a range of delays which it can provide, bounded by a minimum delay and a maximum delay. In one embodiment, the three elements have three different ranges of delay, so that a wide range of total delay can be provided. The wide range is useful for a wide range of reference clock frequencies which a user may select when operating a field programmable device.

During circuit operation, a reference input clock signal is input to the phase-locked loop circuit 10 at an input terminal 11. The reference input clock signal is buffered by a buffer 13 and coupled to a first input X of a phase detector 15. The buffered reference input clock signal is also provided to a voltage controlled delay element 18 and a MUX 21. The phase detector 15 receives a feedback signal at an input terminal Y and produces an error voltage 16 that represents the phase difference between the feedback signal and the reference input clock signal. The error voltage is coupled to the voltage controlled delay elements 18, 19, 20.

The voltage-controlled delay elements 18, 19, 20 are connected to a series of corresponding multiplexers 21, 22, 23 that, in turn, are operated by control signals applied by a corresponding control element 24, 25, 26 to select or deselect a specific delay element or a combination of delay elements, such that the delays may be introduced singly, or they may be cascaded. Thus, the buffered reference input clock signal 17 may be selectively passed through the various voltage-controlled delay elements.

Additional selectable delays are provided by the buffers 27, 28. Thus, the feedback signal may be selected by a control element 30 controlling a multiplexer 29 and thereby select from any of an output-lagging signal 31, an output-in-phase signal 32, or an output-leading signal 33 to create offset options for lagging, in-phase, or leading choices. The feedback signal is also delayed by a feedback delay buffer 14 that compensates for delay that is introduced by the input buffer 13. The output clock signal is coupled to a multiplexer 44 that is operable by application of a control signal 45 to select an inverted output clock signal that is provided via an inverter 46, or a non-inverted output clock signal. A resulting output clock signal 12 is then distributed for use as a delayed, phase corrected clock signal.

Figure 2:
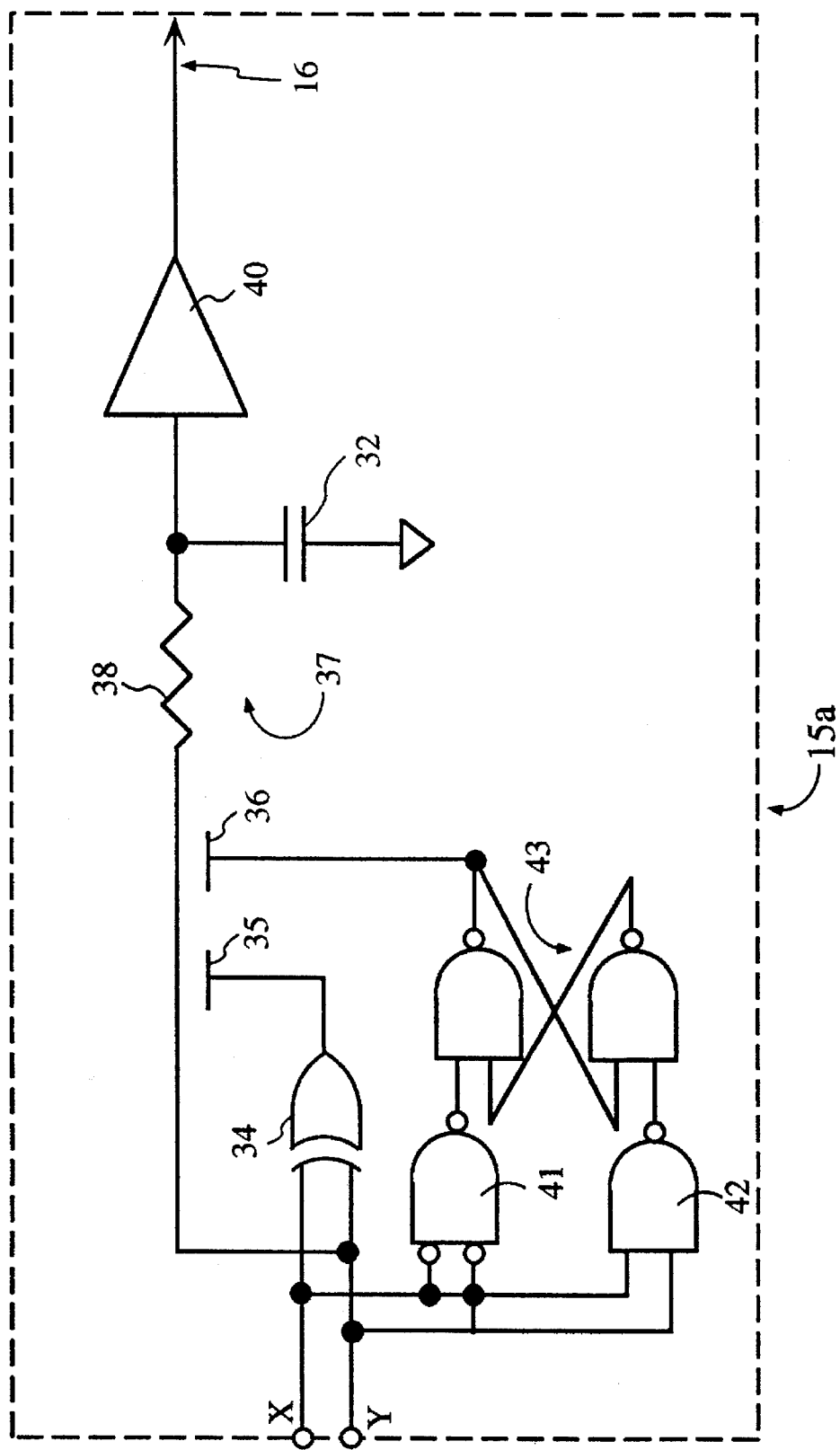
FIG. 2 is a schematic diagram of a phase detector adapted for use in connection with the present invention.

FIG. 2 is a schematic diagram of a first phase detector circuit 15a that is adapted for use in connection with the voltage controlled delay circuit of the present invention. The buffered reference input clock signal is provided to a first phase detector input terminal X and routed to one input terminal of an exclusive OR gate 34. A buffered feedback signal is provided to a second phase detector input terminal Y and routed to another input terminal of the exclusive OR gate. The output of the exclusive OR gate is coupled to a pass transistor 35 such that the presence of either, but not both, of the input signals X or Y allows an error pulse to pass to an integrator/filter circuit 37, comprised of a resistor 38 and a capacitor 39, and to a buffer 40. As a result, the capacitor 39 is charged or discharged and thereby integrates a signal indicative of the phase mismatch between the reference input clock signal and the feedback signal. Buffer 40 is an analog device which provides an output error voltage 16 related to the voltage on capacitor 39. Error voltage 16 is then routed to the voltage-controlled delay elements 18, 19, 20, which operate as discussed above.

The two signals X and Y that are input to the phase detector are also coupled to a NAND gate 41 and a NAND gate 42. The two gates 41, 42 are arranged to detect when an out-of-phase condition exists between the reference input clock signal and the feedback signal, and the gates operate to toggle a latch 43 which, in turn, operates a second pass transistor 36.

Initially, consider that signals X and Y are both logic 0. Exclusive OR gate 34 thus generates a low output signal and turns off transistor 35. The logic 0 signals cause latch 43 to output a logic 1 signal thus turning on transistor 36. When X or Y goes high, XOR gate 34 turns on transistor 35. There is no change in the high output signal from latch 43. Transistors 35 and 36 are thus both on. A high signal on Y increases the charge on capacitor 39. Thus, an increased charge on capacitor 39 increases the output voltage on line 16. This increased voltage increases the delay of voltage controlled delay elements 18, 19, and 20. A low signal on Y decreases the charge on capacitor 39, thus decreasing the delay of elements 18, 19, and 20. When both X and Y are high, NAND gate 42 generates a logic 0 output signal, which causes latch 43 to generate a low output signal, turning off transistor 36. Thus capacitor 39 remains at its adjusted voltage level. (In another embodiment, an increased voltage decreases delay of voltage controlled delay elements 18, 19, 20 and the decreased voltage from a low signal on Y increases the delay of elements 18, 19, 20.)

Thus, when an out-of-phase condition exists, both of the pass transistors 35, 36 conduct following the first transition by either signal to a logic 1, after both signals have first been a logic 0, and a driving signal integrated by the capacitor 39 is provided to the voltage controlled delay elements 18, 19, 20. In this way, the phase detector circuit produces an error voltage that is proportional to the misalignment of the two input signals X and Y.

Figure 3:
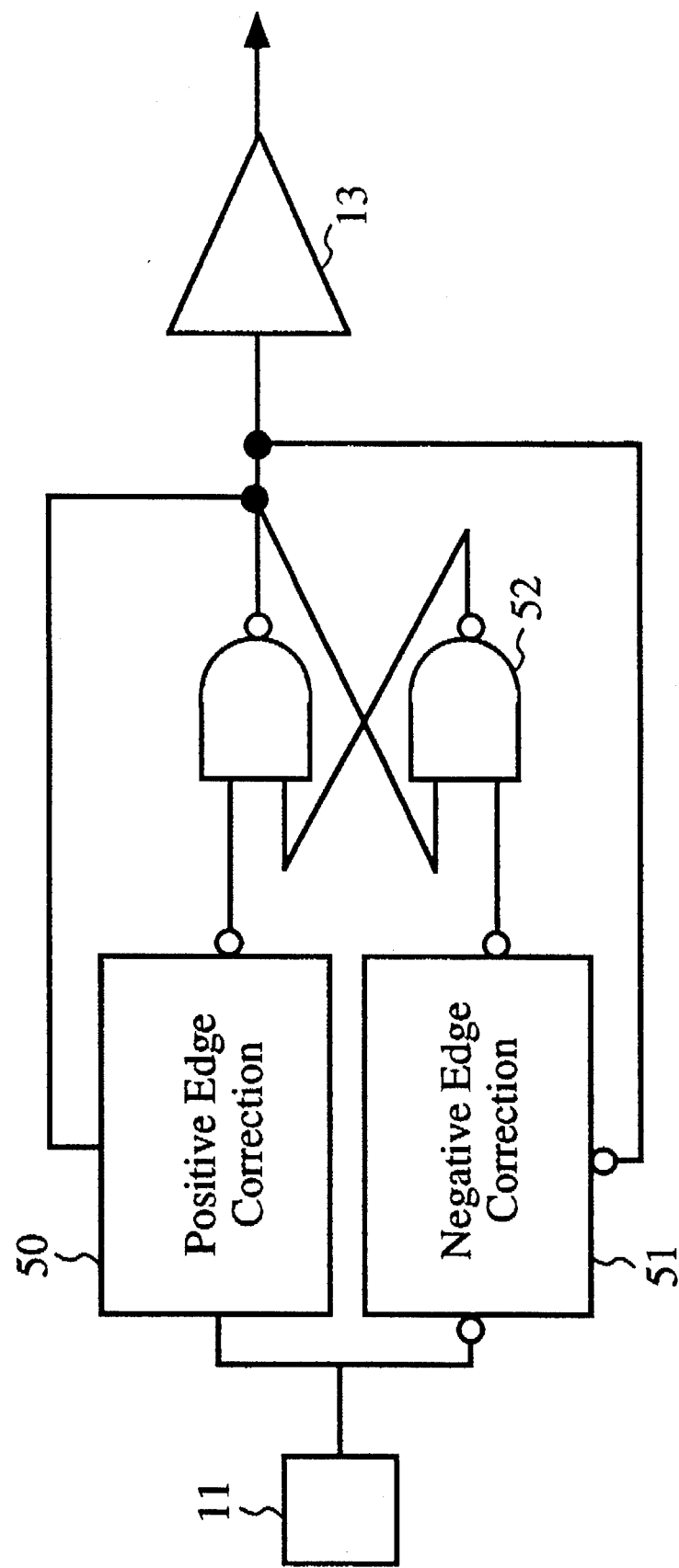
FIG. 3 is a block schematic diagram of a circuit that synchronizes rising and falling edges of a clock signal in connection with the present invention.

It is possible that the delay circuit herein described may not have an equal delay for both rising and falling transitions of the reference input clock signal at input terminal 11 (FIG. 1). FIG. 3 is a block schematic diagram of a circuit that synchronizes both rising edges and falling edges of the output clock signal to the reference input clock signal. In FIG. 3, a reference input clock signal is provided to input terminal 11 and thence to a positive edge correction loop 50 and a negative edge correction loop 51. The output of each loop is latched through a latch circuit 52 and thence through a buffer 13 to the voltage controlled delay circuit herein described. The output of the latch 52 is included within each of the edge correction loops 50 and 51.

Figure 4:
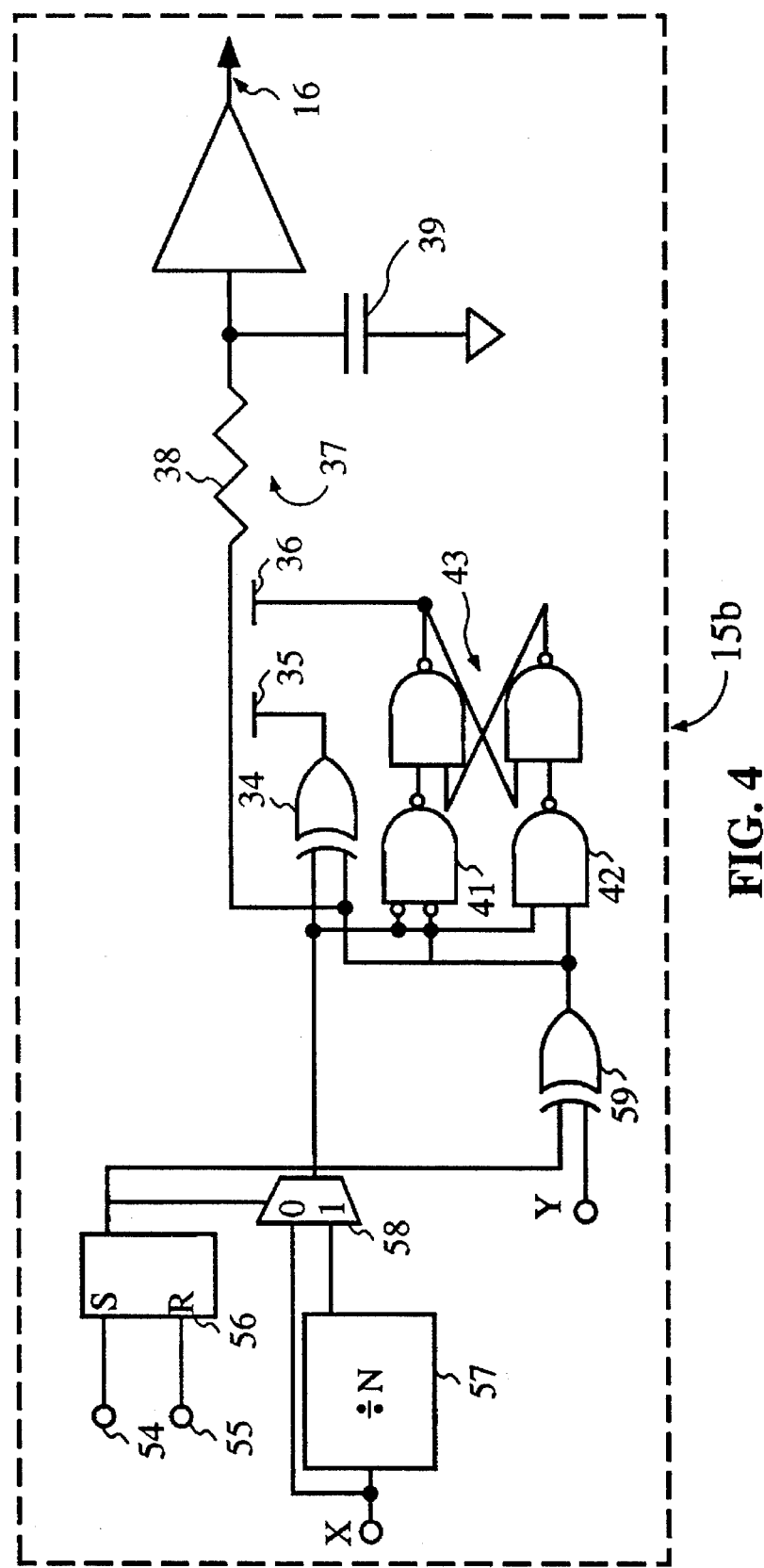
FIG. 4 is a schematic diagram of an alternative phase detector adapted for use in connection with the present invention.

FIG. 4 is a schematic diagram of an alternative phase detector 15b adapted for use in connection with the present invention. In the figure, those elements of the phase detector that are commonly shared with the phase detector circuit shown in FIG. 2, and that therefore have the same function, have been given the same numeric designator. The embodiment of FIG. 4 incorporates two features not provided by the phase detector of FIG. 2, an optional inverter and a divider circuit. That is, an exclusive OR gate 59 is provided to optionally invert the feedback signal Y and align the negative transition of the output clock signal to the positive transition of the reference input clock signal, resulting in a delay adjusted to correspond to the LOW time of the reference input clock signal.

The alternative phase detector circuit 15b also includes a divide by N circuit 57 that produces a signal period that is adjusted to a multiple of the input period. In the exemplary embodiment of the invention, the divide by N circuit divides the reference input clock signal by four, and combined with inversion of the output clock signal discussed above, results in a delay equal to two reference input clock signal cycles. It should be appreciated that the actual amount by which the divide by N circuit divides may be chosen as appropriate for the available delay range to which the invention is put, and that other values may be provided without departing from the spirit and scope of the invention.

The exclusive OR gate and the divide by N circuit allow a rough adjustment of delay, for example when a circuit is initialized, or after a loss of phase lock has occurred. Once phase lock is achieved or restored, an SR flip-flop 56 may be toggled to set the exclusive OR gate 59 to cancel the input signal inversion, and to route the reference input clock signal X around the divide by N circuit 57. Switching of the SR flip-flop may be operator initiated, or it may be automatic, based upon a start signal applied to the terminal 54; and a locked or lock detect signal, applied to the terminal 55.

Figure 5A:
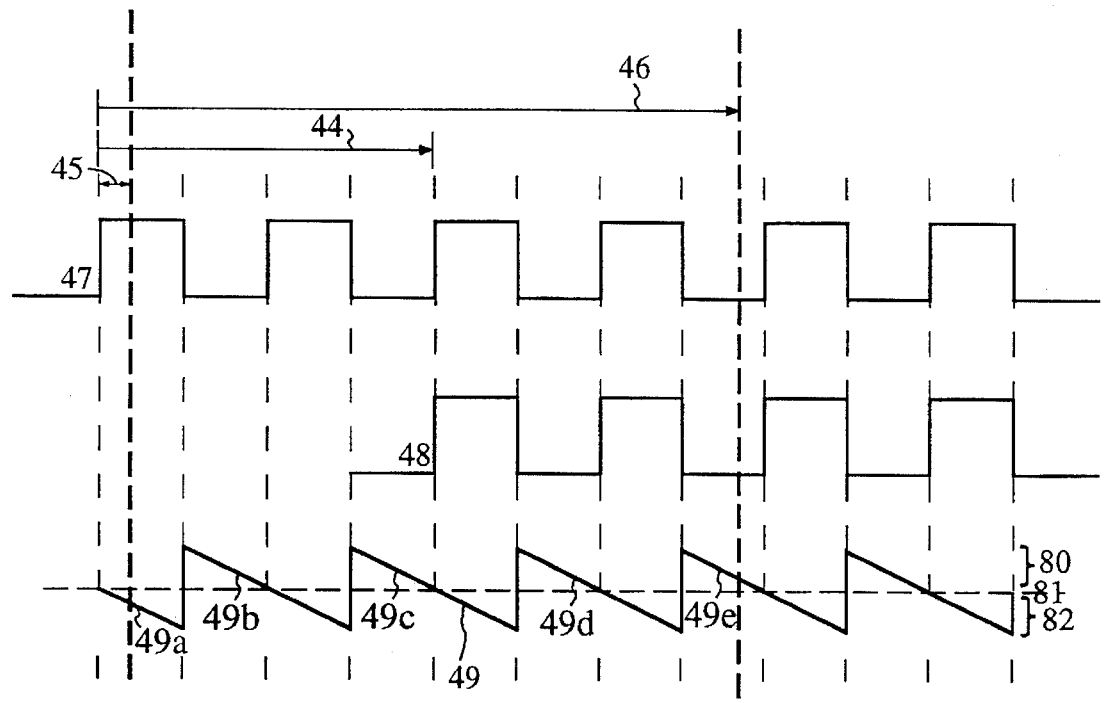
FIG. 5a is a timing diagram that plots phase error v. error voltage according to a first preferred embodiment of the present invention.

The lower curve in FIG. 5a plots phase error between curves 47 and 48 versus error voltage present on line 16 of FIGS. 1, 2, and 4 according to a first preferred embodiment of the present invention. In the upper curves of FIG. 5a, an input clock signal 47 and an output clock signal 48 are plotted. Output clock signal 48 is shown in the figure to be in-phase with the input clock signal 47, but displaced by an integer number of cycles from the input signal, as indicated by line 44. The allowable range of total delay is indicated by a minimum delay, line 45, and a maximum delay, line 46. The minimum delay 45 is a function of the number of delay elements 18, 19, and 20, which have been inserted into the delay path by control elements 24, 25, and 26 (FIG. 1). For any number of elements being used, the system has a minimum delay 45 determined by the sum of the minimum delays of those delay elements in the path. The system also has a maximum delay 46 determined by the sum of the maximum delays of the delay elements in the path. (Typically, a user will program the circuit using control elements 24, 25, 26 to place more delay elements 18, 19, 20 into the path when the clock frequency is low, say 10 MHz, and fewer delay elements 18, 19, 20 into the path when the clock frequency is high, say 100 MHz.)

A sawtooth curve 49 having a series of diagonal lines indicates the phase variations of output clock signal 48 for which the phase detector produces a signal that indicates it is necessary to increase the amount of delay (80), that there is no error detected (81), or that it is necessary to decrease the amount of delay (82). In FIG. 5a, three cycles 49b, 49c, 49d of curve 49 exist between the minimum delay 45 and the maximum delay 46 which can be generated by voltage controlled delay elements 18, 19, 20. If the delay generated by delay elements 18, 19, 20 falls anywhere along one of these complete cycles the output signal indicating whether delay should be increased or decreased will cause delay to be adjusted in the proper direction.

If the circuit is operating in region 49a at or near the minimum delay portion of the operating range, the resulting correction voltage attempts to produce a delay that is out of the permissible delay range. Because the minimum delay which the delay elements 18, 19, 20 can produce is at line 45, no additional reduction in delay is possible and the circuit would not therefore adjust to provide a correct amount of delay. A similar situation exists in region 49e. For this reason, the phase detector shown in FIG. 4 provides a rough initialization adjustment to bring the error voltage within the middle of the delay voltage range, between the maximum and minimum extremes.

Figure 5B:
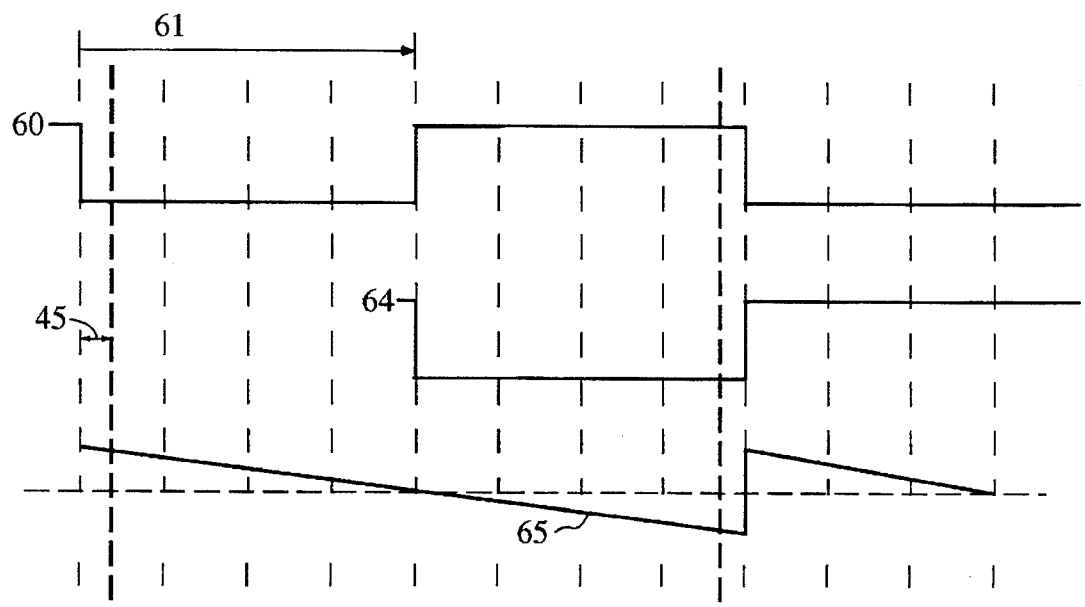
FIG. 5b is a timing diagram that plots phase error v. error voltage according to a second preferred embodiment of the present invention.

FIG. 5b is a timing diagram that plots phase error v. error voltage according to the second preferred embodiment of the present invention shown in FIG. 4. In FIG. 5b, the reference input clock signal 60 is plotted having one fourth the input frequency 47 of FIG. 5a and an inverted feedback signal 64 derived from an output clock signal. The unit of time 61 in FIG. 5b is the same as time unit 44 of FIG. 5a. In FIG. 5b, inversion of the output signal causes the error voltage to adjust the delay to be the duration of the low level of the input clock signal 61. The value of the divide by N circuit can be chosen so that the delay falls between minimum delay 45 and maximum delay 46. Once the delay is adjusted using inversion and the longer cycle time, the inversion can be discontinued, and the division circuit 57 bypassed. Thus, the rough adjustment circuit is switched out of the delay path, and a more precise delay correction signal is then produced. The circuit continues operating as per FIG. 5a with a delay in the acceptable range.

Figure 6:
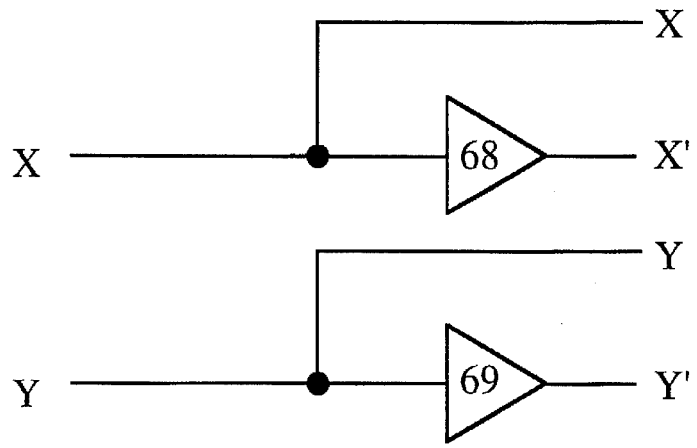
FIG. 6 is a schematic diagram of a delay circuit adapted for use with a lock/unlock detector circuit according to an alternative preferred embodiment of the invention.

FIG. 6 is a schematic diagram of a delay circuit adapted for use with a lock/unlock detector circuit according to an alternative preferred embodiment of the invention, for example in connection with the phase detector of FIG. 4 (discussed above) and the detection circuit of FIG. 9 (discussed below). The delay circuit inserts a buffer 68, 69 into each of the input signal paths X and Y, such that each signal includes a "real time" signal X and Y, respectively, and a slightly delayed version thereof X' and Y', respectively). Signals X, X', Y and Y' can be used for determining the direction of the error when X and Y are out of phase and thus allow for taking corrective action when the X and Y signals are out of phase. Buffers 68, 69 preferably have a delay which is small (less than 20%) with respect to the shortest clock period at which the circuit can operate.

Figure 7:
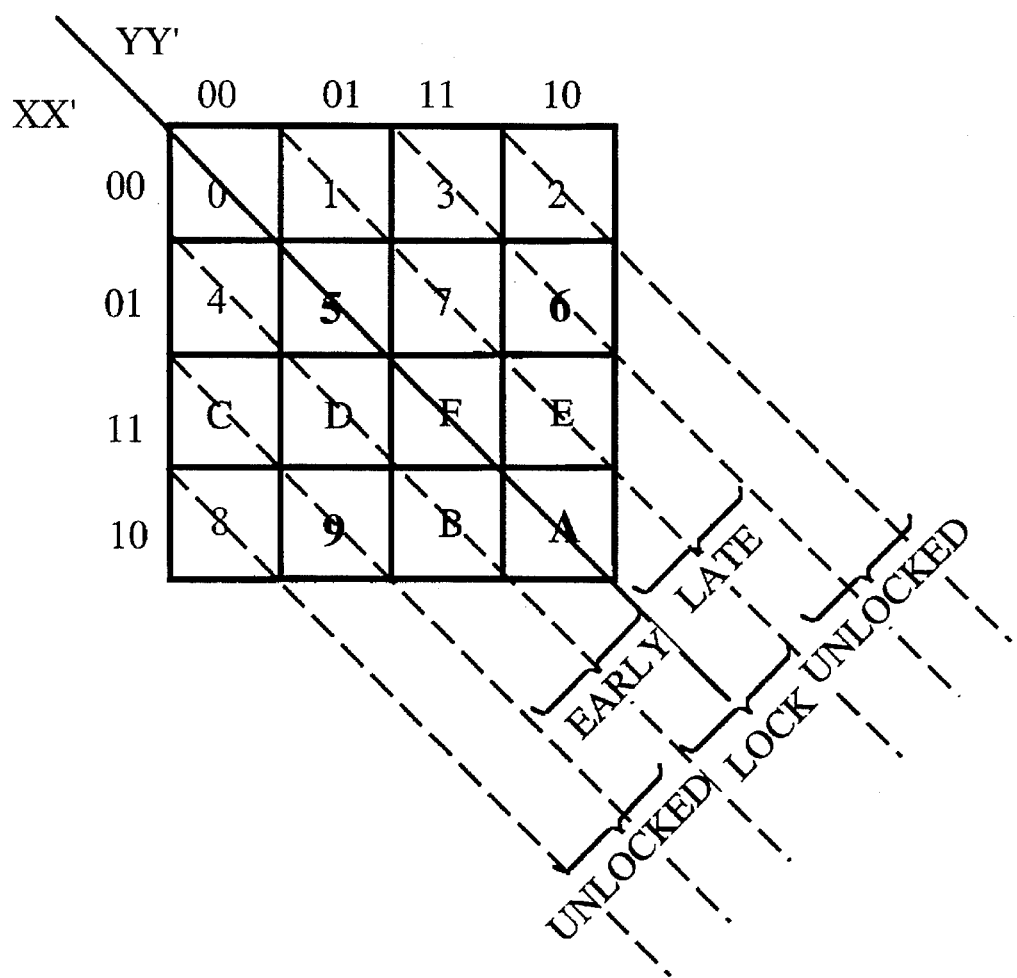
FIG. 7 is a Karnaugh map showing various phase-locked loop states of operation in accordance with the invention.

FIG. 7 is a Karnaugh map showing various operating states of the delay circuit in accordance with the invention. Each state is derived from the real-time and delayed signals produced in accordance with the circuit of FIG. 6. If the combinations of the reference input clock signal X with its delayed version X', and feedback signal Y and its delayed signal Y' are considered, the lines drawn through the Karnaugh map of FIG. 7 indicate the states in which the phase-locked loop is in-phase (A, F, 5, 0) and various degrees of out-of-phase, including Late Locked states A, E, F, 7, 5, 1, 0, 8, Late Unlocked states 6, 7, 3, 1, 9, 8, C, E and Early Unlocked states 9, D, C, 4, 6, 2, 3, B.

Figure 8:
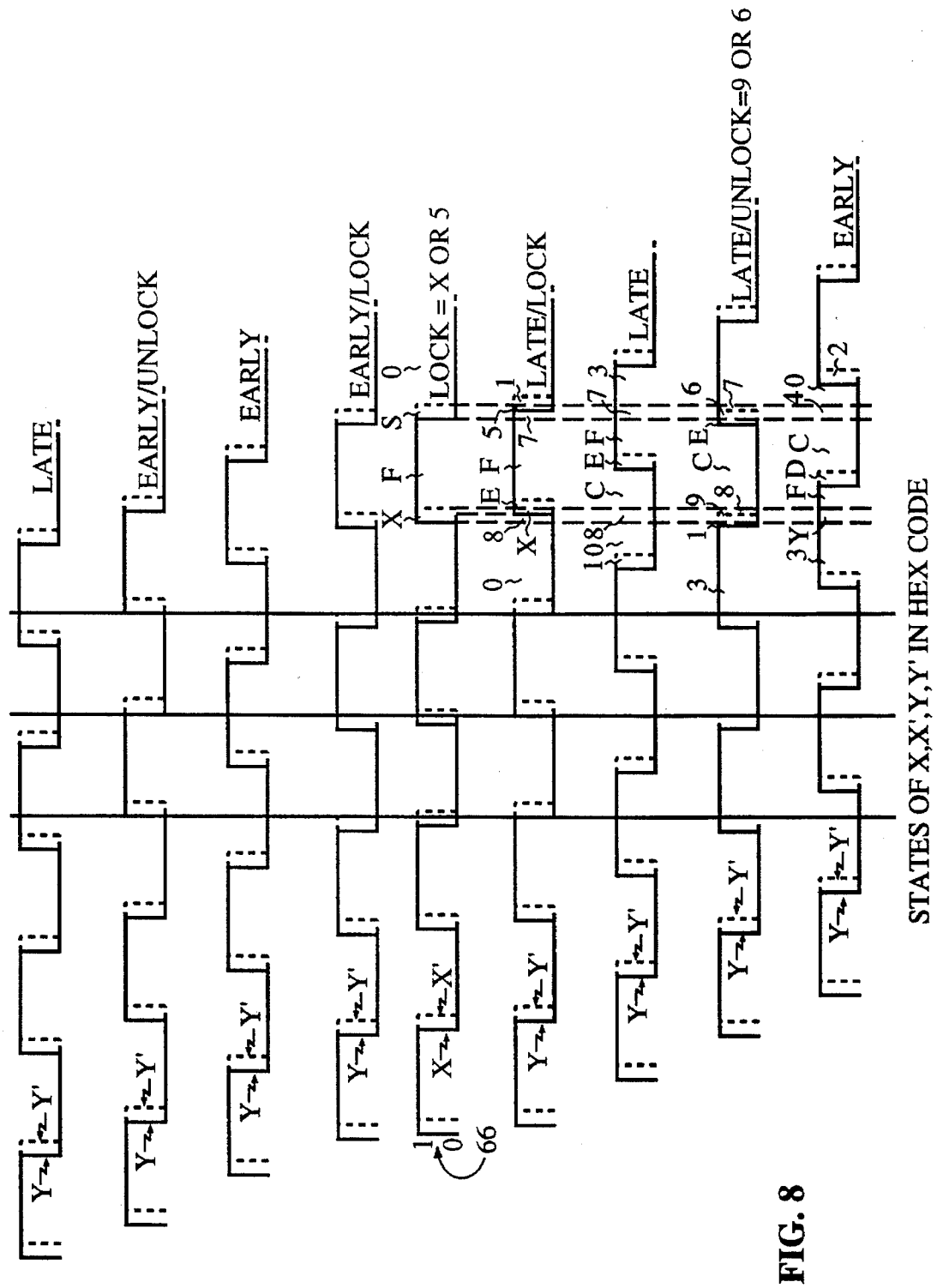
FIG. 8 is a timing diagram showing various phase-locked delay loop states according to the present invention.

FIG. 8 is a timing diagram showing the phase-locked delay loop states illustrated in FIG. 7, relative to a correct phase signal 94. In the figure, the input waveform X is shown as a solid line, while the slightly delayed version of the signal X' is shown as a dashed line. The figure also shows feedback waveform Y, along with similarly delayed version Y'. After both of signals X and Y have been logic 0, the reference clock signal X goes to logic 1 as indicated in curve 95. A short time later, as indicated in curve 95, Y goes high. The time between these two events is indicated in FIGS. 7 and 8 by hex 8, and causes an error voltage adjustment. After Y goes high (and X remains high), state A is entered, which does not generate an error voltage adjustment. A short time later, when delayed signal X' goes high but Y' is still low, state E is entered, also shown on FIG. 7 as indicating that output signal Y is late with respect to reference clock signal X. When both of X' and Y' become high, state F is entered, during which time no further error adjustment signal is generated. Subsequently, states 7, 5, and 1 are entered as X and Y go low. Curve 96 shows a phase relationship in which output signal Y is more late with respect to reference clock signal X. Curve 97 indicates a phase relationship which is identified by FIG. 9 as unlocked. That is, states 9 and 6 are entered for part of the cycle. Curve 98 indicates an offset in which the output signal is sufficiently delayed from the input reference clock signal as to be recognized as early with respect to the input reference clock signal.

Figure 9:
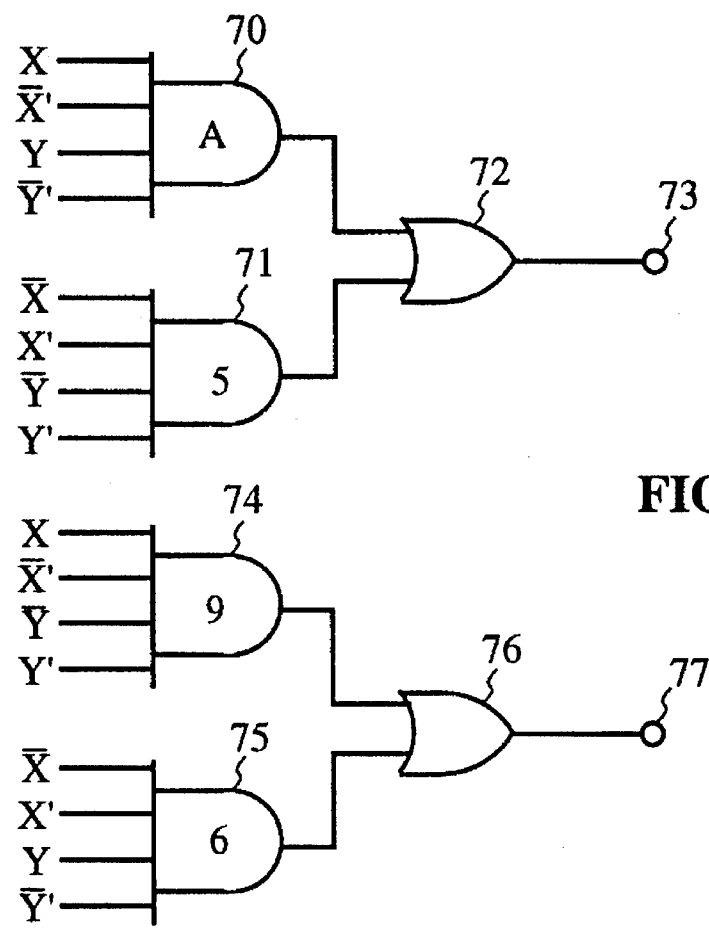
FIG. 9 is a schematic diagram of a lock/unlock indicator circuit for use in connection with the delay circuit of FIG. 6, and implementing a state detector in accordance with the various states illustrated in the Karnaugh map of FIG. 7.

FIG. 9 is a schematic diagram of a lock/unlock indicator circuit for use in connection with the delay circuit of FIG. 6, that implements a state detector in accordance with states A, 5, 9, and 6 illustrated in the Karnaugh map of FIG. 7. Thus, various combinations of the reference input clock signal X with its delayed version X' and a feedback signal Y and its delayed signal Y' are coupled to AND gates 70, 71 and thence to an OR gate 72 to decode and thereby detect a locked state (states A and 5 in FIG. 7), which is output as a locked signal 73; while such signals are also coupled to AND gates 74, 75 and thence to an OR gate 76 to decode and thereby detect an unlocked state (states 9 and 6 in FIG. 7), which is output as an unlocked signal 77. Detection of the in-phase states (states A and 5) indicates a locked condition. Detection of an unlocked condition (states 9 and 6) can be used to initiate a relock operation, for example by generating an external output signal which can be used to indicate an error, or by providing an unlocked signal to the phase detector circuit of FIG. 4. These signals may be used in connection with the phase detector of FIG. 4 to initiate or cancel a rough error voltage adjustment sequence. In the embodiment of FIG. 8, when the output signal Y is in its desired phase, it matches the input signal X within the tolerance indicated by the signal X'. When the output signal Y is late, as indicated by curve 97, the decode circuits of FIG. 9 will detect the unlocked states (9 and 6) for part of the clock cycle. Thus, an unlocked signal can be used to initiate corrective action or to generate an external error message.

Figure 10:
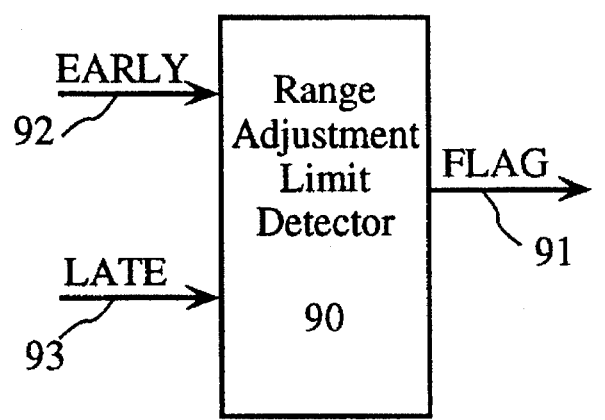
FIG. 10 is a schematic representation of a range adjust limit detector circuit according to the invention.

A limit count of consecutive early or consecutive late states can be used to indicate the need for a rough phase adjustment. FIG. 10 is a schematic representation of a range adjust limit detector circuit 90 according to the invention. The circuit provides a means of detecting a number of consecutive early or consecutive late conditions, 92 and 93 respectively. If the consecutive number of such conditions, either all early or all late, exceeds a predetermined value, then a range adjust limit is detected and a flag or signal 91 is generated to indicate such condition.

Although the invention is described herein with reference to the preferred embodiments, one skilled in the art will readily appreciate that other applications may be substituted for those set forth herein without departing from the spirit and scope of the present invention. Accordingly, the invention should only be limited by the Claims included below.

We claim:

1. A phase-locked loop, comprising:
   a phase detector including a first terminal connected to receive a reference input clock signal, and a second terminal connected to receive an output feedback signal, said phase detector producing a phase detector output signal indicative of a phase difference between said reference input clock signal and said output feedback signal;
   a plurality of voltage controlled delay elements connected to receive said phase detector output signal, each of said voltage controlled delay elements having an input terminal and an output terminal and producing at said output terminal a signal that is delayed from a signal at said input terminal by an amount that is a function of said phase detector output signal; and
   means for placing in series into a feedback path between said first and second terminals any combination of said plurality of voltage controlled delay elements to produce said output feedback signal;
   further comprising:
   selectable phase off-set means for placing into said feedback path a selected number of additional delay elements and producing an output clock signal such that said output clock signal has any of a leading, lagging, and in-phase relationship to said output feedback signal.

2. A phase-locked loop comprising:
   a phase detector including a first terminal connected to receive a reference input clock signal, and a second terminal connected to receive an output feedback signal, said phase detector producing a phase detector output signal indicative of a phase difference between said reference input clock signal and said output feedback signal;
   a plurality of voltage controlled delay elements connected to receive said phase detector output signal, each of said voltage controlled delay elements having an input terminal and an output terminal and producing at said output terminal a signal that is delayed from a signal at said input terminal by an amount that is a function of said phase detector output signal; and
   means for placing into a delay path between said first and second terminals a selected number of said plurality of voltage controlled delay elements to produce said output feedback signal;
   said phase detector further comprising:
   a phase detector circuit providing an output signal indicating a phase mismatch between said reference input clock signal and said output feedback signal;
   an integrator for accumulating a charge indicative of said detected phase mismatch; and
   pass means connected to couple one of said reference input clock signal and said output feedback signal to said integrator when said phase detector circuit output signal indicates a phase mismatch;
   said phase detector further comprising:
   a range adjustment circuit comprising:
   an inverter connected to invert one of said reference input clock and output feedback signals; and
   a divide by N circuit for generating a range adjustment signal having a period that is a multiple of said reference input clock period; and
   means for activating said inverter and substituting said range adjustment signal for said reference input clock signal.

3. A phase-locked loop to compensate for propagation delays associated with distribution of an output clock signal, comprising:
   an input buffer connected to receive a reference input clock signal and to provide an output clock distribution signal corresponding thereto;
   a phase detector including a first terminal connected to receive said reference input clock signal from said input buffer, and a second terminal connected to receive a feedback signal, said phase detector producing an output signal indicative of a phase difference between said reference input clock signal and said feedback signal;
   a plurality of independently selectable voltage controlled delay elements connected to operate alone and in combination with one another, each voltage controlled delay element connected to receive said phase detector output signal, said voltage controlled delay elements producing said feedback signal, wherein said feedback signal is in-phase with said reference input clock signal, and is delayed by an integer number of clock cycles relative to said reference input clock signal; and
   selectable phase off-set means for producing any of a leading, lagging, and in-phase relationship between said reference input clock signal and said output clock distribution signal to compensate for propagation delays attendant with a selected output clock distribution scheme.

4. The phase locked loop of claim 3, said phase detector further comprising:
   a phase detector circuit for detecting a phase mismatch between said reference input clock signal and said feedback signal;
   an integrator for accumulating a charge indicative of said detected phase mismatch; and
   pass means connected to couple said feedback signal to said integrator when a phase mismatch is detected.

5. The phase locked loop of claim 4, said phase detector further comprising:
   means for selectively switching said phase locked loop between a normal mode of operation and a range adjustment mode of operation in which a range adjustment circuit is coupled into said phase locked loop to bring said phase locked loop within its operating range; said range adjustment circuit comprising:
   an inverter connected to invert one of said reference input clock and feedback signals; and a divide by N circuit for adjusting said phase locked loop to provide a reference signal having a period that is a multiple of said reference input clock period;

wherein said divide by N circuit and said inverter cooperate to produce a delay of at least one reference input clock cycle.

6. The phase locked loop of claim 3, further comprising:

input means connected to receive said reference input clock signal and said feedback signal; and structured to derive a delayed reference input clock signal and a delayed feedback signal therefrom; and logic means coupled to receive said reference input clock signal, said feedback signal, and said delayed reference input clock and feedback signals, and for generating a phase-lock status signal indicative of a phase locked loop locked and unlocked condition in response to said reference input clock signal, said feedback signal, and said delayed reference input clock and feedback signals.

7. The phase locked loop of claim 6, further comprising:

means responsive to said phase-lock status signal for selectively switching said phase locked loop between a normal mode of operation when said phase locked loop is phase-locked; and a range adjustment mode of operation when said phase locked loop in unlocked, in which a range adjustment circuit is coupled into said phase locked loop, wherein a range delay adjustment is made to bring said phase locked loop within its operating range; said range adjustment circuit comprising:

an inverter connected to invert one of said reference input clock and feedback signals; and a divide by N circuit for providing a reference signal having a period that is a multiple of said reference input clock period;

wherein said divide by N circuit and said inverter cooperate to produce a delay of at least one reference input clock cycle.

8. A method of compensating for propagation delays associated with distribution of an output clock signal, comprising the steps of:

receiving a reference input clock signal at a first input terminal of a phase detector;

receiving a feedback signal at a second input terminal of said phase detector;

producing a phase detector output signal indicative of a phase difference between said reference input clock signal and said feedback signal;

generating a plurality of signal delays to be applied to said reference input clock signal, each of said signal delays being controlled by the voltage of said phase detector output signal;

selectively applying any combination of said plurality of signal delays to said reference input clock signal to produce said feedback signal such that said feedback signal is brought into phase with said reference input clock signal;

producing said output clock signal having a selected one of a leading, lagging, and in-phase relationship to said feedback signal to compensate for propagation delays attendant with distribution of said output clock signal.

9. A method of compensating for propagation delays associated with distribution of an output clock signal, comprising the steps of:

receiving a reference input clock signal at a first input terminal of a phase detector;

receiving a feedback signal at a second input terminal of said phase detector;

producing a phase detector output signal indicative of a phase difference between said reference input clock signal and said feedback signal;

generating a plurality of signal delays to be applied to said reference input clock signal, each of said signal delays being controlled by the voltage of said phase detector output signal;

selectively combining said plurality of signal delays to produce said feedback signal such that said feedback signal is brought into phase with said reference input clock signal;

producing said output clock signal having a selected one of a leading, lagging, and in-phase relationship to said feedback signal to compensate for propagation delays attendant with distribution of said output clock signal; and further comprising the steps of:

detecting a phase mismatch between said reference input clock signal and said feedback signal; and accumulating a charge indicative of said detected phase mismatch in an integrator when a phase mismatch is detected.

10. A method of compensating for propagation delays associated with distribution of an output clock signal, comprising the steps of:

receiving a reference input clock signal at a first input terminal of a phase detector;

receiving a feedback signal at a second input terminal of said phase detector;

producing a phase detector output signal indicative of a phase difference between said reference input clock signal and said feedback signal;

generating a plurality of signal delays to be applied to said reference input clock signal, each of said signal delays being controlled by the voltage of said phase detector output signal;

selectively combining said plurality of signal delays to produce said feedback signal such that said feedback signal is brought into phase with said reference input clock signal;

producing said output clock signal having selected one of a leading, lagging, and in-phase relationship to said feedback signal to compensate for propagation delays attendant with distribution of said output clock signal; and further comprising range adjustment steps of:

inverting one of said reference input clock and feedback signals;

dividing by N said reference input clock signal to provide a temporary reference input signal having a period that is a multiple of said reference input clock period; and replacing said phase detector output signal with a temporary phase detector output signal indicative of a phase difference between said temporary reference input signal and a complement of said feedback signal.

11. A method of compensating for propagation delays associated with distribution of an output clock signal, comprising the steps of:

receiving reference input clock signal at a first input terminal of a phase detector;

receiving a feedback signal at a second input terminal of said phase detector;

producing a phase detector output signal indicative of a phase difference between said reference input clock signal and said feedback signal;

generating a plurality of signal delays to be applied to said reference input clock signal, each of said signal delays being controlled by the voltage of said phase detector output signal;

selectively combining said plurality of signal delays to produce said feedback signal such that said feedback signal is brought into phase with said reference input clock signal;

producing said output clock signal having a selected one of a leading, lagging, and in-phase relationship to said feedback signal to compensate for propagation delays attendant with distribution of said output clock signal; and further comprising the steps of:
  receiving said reference input clock signal and said feedback signal;
  deriving a delayed reference input clock signal and a delayed feedback signal therefrom; and
  decoding a phase-lock status signal from said reference input clock signal, said feedback signal, and said delayed reference input clock and feedback signals, said status signal being indicative of a delay path locked and unlocked condition.

12. A method of compensating for propagation delays associated with distribution of an output clock signal, comprising the steps of:

receiving a reference input clock signal at a first input terminal of a phase detector;

receiving a feedback signal at a second input terminal of said phase detector;

producing a phase detector output signal indicative of a phase difference between said reference input clock signal and said feedback signal;

generating a plurality of signal delays to be applied to said reference input clock signal, each of said signal delays being controlled by the voltage of said phase detector output signal;

selectively combining said plurality of signal delays to produce said feedback signal such that said feedback signal is brought into phase with said reference input clock signal;

producing said output clock signal having a selected one of a leading, lagging, and in-phase relationship to said feedback signal to compensate for propagation delays attendant with distribution of said output clock signal; and further comprising the step of:
  selectively switching between a normal mode of operation when said reference input clock signal and said feedback signal are phase-locked; and a range adjustment mode of operation in which a range adjustment circuit is coupled to said reference input clock signal and said feedback signal when said reference input clock signal and said feedback signal are unlocked, wherein a range adjustment is made to bring said signal delays within their operating range.

* * * * *

UNITED STATES PATENT AND TRADEMARK OFFICE
CERTIFICATE OF CORRECTION

PATENT NO. : 5,646,564

DATED : July 8, 1997

INVENTOR(S) : Charles R. Erickson, Philip M. Freidin and Kerry M. Pierce

It is certified that error appears in the above-identified patent and that said Letters Patent is hereby corrected as shown below:

Col. 6, line 27, "FIG. 2," should read --FIG. 2:--.

Col. 8, line 24, "curve 95" should read --curve 94--.( 1st. occurr.)

Col. 12, line 44, "having selected" should read --having a selected--.

Col. 12, line 64, "receiving reference" should read --receiving a reference--.

Signed and Sealed this

Nineteenth Day of May, 1998

*Attest:*

BRUCE LEHMAN

*Attesting Officer*  *Commissioner of Patents and Trademarks*